(12) United States Patent
Whitted

(10) Patent No.: US 6,870,095 B1
(45) Date of Patent: Mar. 22, 2005

(54) CABLE MANAGEMENT FOR RACK MOUNTED COMPUTING SYSTEM

(75) Inventor: William H. Whitted, Palo Alto, CA (US)

(73) Assignee: Google Inc., Mountain View, CA (US)

(*) Notice: Subject to any disclaimer, the term of this patent is extended or adjusted under 35 U.S.C. 154(b) by 0 days.

(21) Appl. No.: 10/675,238

(22) Filed: Sep. 29, 2003

(51) Int. Cl.$^7$ .................................................. H02G 3/04
(52) U.S. Cl. ........................ 174/48; 174/72 A; 174/135; 385/135; 385/134
(58) Field of Search ................................ 174/48, 65 R, 174/68.1, 68.3, 135, 72 A, 101, 100; 385/134, 135; 361/826, 827; 248/56, 48, 68.1, 58, 65, 89; 211/26

(56) References Cited

U.S. PATENT DOCUMENTS

| | | | | |
|---|---|---|---|---|
| 5,093,887 A | * | 3/1992 | Witte ......................... | 385/135 |
| 5,902,961 A | * | 5/1999 | Viklund et al. ............. | 174/100 |
| 6,318,680 B1 | * | 11/2001 | Benedict et al. ........... | 174/72 A |
| 6,347,714 B1 | * | 2/2002 | Fournier et al. ............ | 361/826 |
| 6,365,834 B1 | * | 4/2002 | Larsen et al. ............... | 174/100 |
| 6,380,484 B1 | * | 4/2002 | Theis et al. ................. | 174/68.3 |
| 6,504,100 B2 | * | 1/2003 | Krietzman et al. ......... | 174/100 |
| 6,605,782 B1 | * | 8/2003 | Lawrence et al. .......... | 174/101 |
| 6,686,541 B2 | * | 2/2004 | Chan ......................... | 174/72 A |

* cited by examiner

*Primary Examiner*—Chau N. Nguyen
*Assistant Examiner*—Angel R. Estrada
(74) *Attorney, Agent, or Firm*—Jung-hua Kuo

(57) ABSTRACT

Systems and methods for cable management in rack-mounted computing systems for housing electronics devices such as servers are disclosed. The cable management system generally includes a cable management housing to substantially enclose the cables therein. The housing defines openings to contain cables extending therethrough, each opening having a first and a second portion each configured to contain cables extending therethrough and a passage portion extending between the first and second opening portions and configured to allow passing of at least one cable between the first and second portions. The first and second portions may be disposed proximal and distal to the electronics devices to allow the cables extending therethrough to be in first or second cable position, respectively. While connected to the electronics devices, the cables extend through the first portion and are in a first cable position. While disconnected to the electronics devices, the cables extend through the second portion and are in a second cable position.

21 Claims, 2 Drawing Sheets

CABLE MANAGEMENT FOR RACK MOUNTED COMPUTING SYSTEM

BACKGROUND OF THE INVENTION

1. Field of the Invention

The present invention relates generally to rack-mounted computing systems. More specifically, systems and methods for cable management in rack-mounted computing systems for housing electronics devices such as servers are disclosed.

2. Description of Related Art

Many of today's more complex computing systems such as computer server systems are often rack-mounted systems in which a number of removable electronics modules, such as electronics trays, are positioned and stacked relative to each other in a shelf-like manner within a frame or rack. Rack-mounted systems allow the arrangement of several of the electronics modules in a vertical orientation for efficient use of space. Each electronics module can be slid into and out of the rack-mounting system. Typically, the electronics modules are inserted from the front of the rack and various cables such as data cables, power cables, etc., are connected to the electronics modules at the front and/or rear of the rack.

Each electronics module may correspond to a different server or each electronics module may hold one or more components of a server. Examples of electronics modules include modules for processing, storage such as random access memory (RAM), network interfaces and controllers, disk drives such as floppy disk drives, hard drives, compact disk (CD) drives, and digital video disk (DVD) drives, parallel and serial ports, small computer systems interface (SCSI) bus controllers, video controllers, power supplies, and so forth. A server farm in today's computing environment may include numerous racks that hold various types of computer-related modules.

For maintenance purposes, it is often desirable to remove an entire module from the rack for servicing and then return the module to the rack. Oftentimes, the remainder of the server system is still in operation while maintenance is performed on a particular module or a particular component within the module. For example, when a component on a particular electronics module is to be serviced or replaced, a service technician would need to remove the particular electronics module from the server rack and then remove the server component from the electronics module. In order to minimize system downtime and to reduce the effect of maintenance on the system's overall operation, the process of removing the electronics module from and returning the electronics module to the rack by a service technician should be convenient, quick and easy.

In addition to physically removing the entire electronics module from the rack for servicing and then returning the module to the rack, the cables connected to the electronics module also need to be addressed. However, because a large number of cables may be coupled to the numerous electronics modules housed within the rack, disconnecting and connecting the correct cables can quickly become be a complex, time consuming and daunting task for the service technician. In addition, the cables can become entangled and/or stressed, increasing the possibility that the cables may be damaged or incorrectly disconnected or connected.

Thus, it would be desirable to provide a cable management mechanism that allows the numerous cables connected to the electronics components within the rack to be collected and organized for convenient, accurate, and easy access.

SUMMARY OF THE INVENTION

Systems and methods for cable management in rack-mounted computing systems for housing electronics devices such as servers are disclosed. It should be appreciated that the present invention can be implemented in numerous ways, including as a process, an apparatus, a system, a device, or a method. Several inventive embodiments of the present invention are described below.

According to one embodiment, the cable management system generally includes a cable management housing to substantially enclose the cables therein. The housing defines openings to contain cables extending therethrough, each opening having a first and a second portion each configured to contain cables extending therethrough and a passage portion extending between the first and second opening portions and configured to allow passing of at least one cable between the first and second portions. The first and second portions may be disposed proximal and distal to the electronics devices to allow the cables extending therethrough to be in first or second cable position, respectively. While connected to the electronics devices, the cables extend through the first portion and are in a first cable position. While disconnected to the electronics devices, the cables extend through the second portion and are in a second cable position.

The first and second opening portions may be generally circular. The cable management housing may be rectangular having a corner proximal to the devices and where the passage portion is generally a bent portion extending from each of the two sides of the corner. The first and second opening portions may be disposed on the opposing sides of the corner such that the first and second opening portions are disposed at an angle relative to each other, e.g., approximately 90°. The cable management housing may provide a removable side portion to allow access to the cables housed within the cable management housing.

According to another embodiment, a cable management apparatus for managing cables to be connected to electronics devices coupled to removable modules in a rack-mounted system generally includes a cable management housing extending along the removable modules to house the cables to be managed therein, the cable management housing defining openings configured to contain cables extending therethrough. Each opening may include a first and a second portion each configured to contain cables extending therethrough and a passing portion extending between the first and second portions. The passing portion may be configured to allow passing of at least one cable between the first and second portions. The first and second portion may be at an angle relative to each other.

Each opening may correspond to at most one removable module of the rack-mounted system. The first opening portion is disposed proximal to the electronics devices to allow the cables passing therethrough to be in a first position for connection to the electronics devices. The second opening portion is disposed distal to the devices in the rack-mounted system to allow the cables passing therethrough to be in a second position corresponding to the cables being disconnected from the electronics devices.

According to yet another embodiment, a method for managing cables to be connected to electronics devices generally includes routing cables through a cable management housing to substantially enclose the cables therein, passing a portion of a cable through a first portion of one of the openings defined in the cable management housing, the openings being configured to contain cables extending therethrough, each opening including a first and second portion each configured to contain cables extending therethrough and a passage portion extending between the first and second portions to allow passage of a cable therebetween, and passing the portion of the cable through the passage portion to the second portion of the opening.

These and other features and advantages of the present invention will be presented in more detail in the following detailed description and the accompanying figures which illustrate by way of example the principles of the invention.

BRIEF DESCRIPTION OF THE DRAWINGS

The present invention will be readily understood by the following detailed description in conjunction with the accompanying drawings, wherein like reference numerals designate like structural elements.

DESCRIPTION OF SPECIFIC EMBODIMENTS

Systems and methods for cable management in rack-mounted computing systems for housing electronics devices such as servers are disclosed. The following description is presented to enable any person skilled in the art to make and use the invention. Descriptions of specific embodiments and applications are provided only as examples and various modifications will be readily apparent to those skilled in the art. The general principles defined herein may be applied to other embodiments and applications without departing from the spirit and scope of the invention. Thus, the present invention is to be accorded the widest scope encompassing numerous alternatives, modifications and equivalents consistent with the principles and features disclosed herein. For purpose of clarity, details relating to technical material that is known in the technical fields related to the invention have not been described in detail so as not to unnecessarily obscure the present invention.

Figure 1:
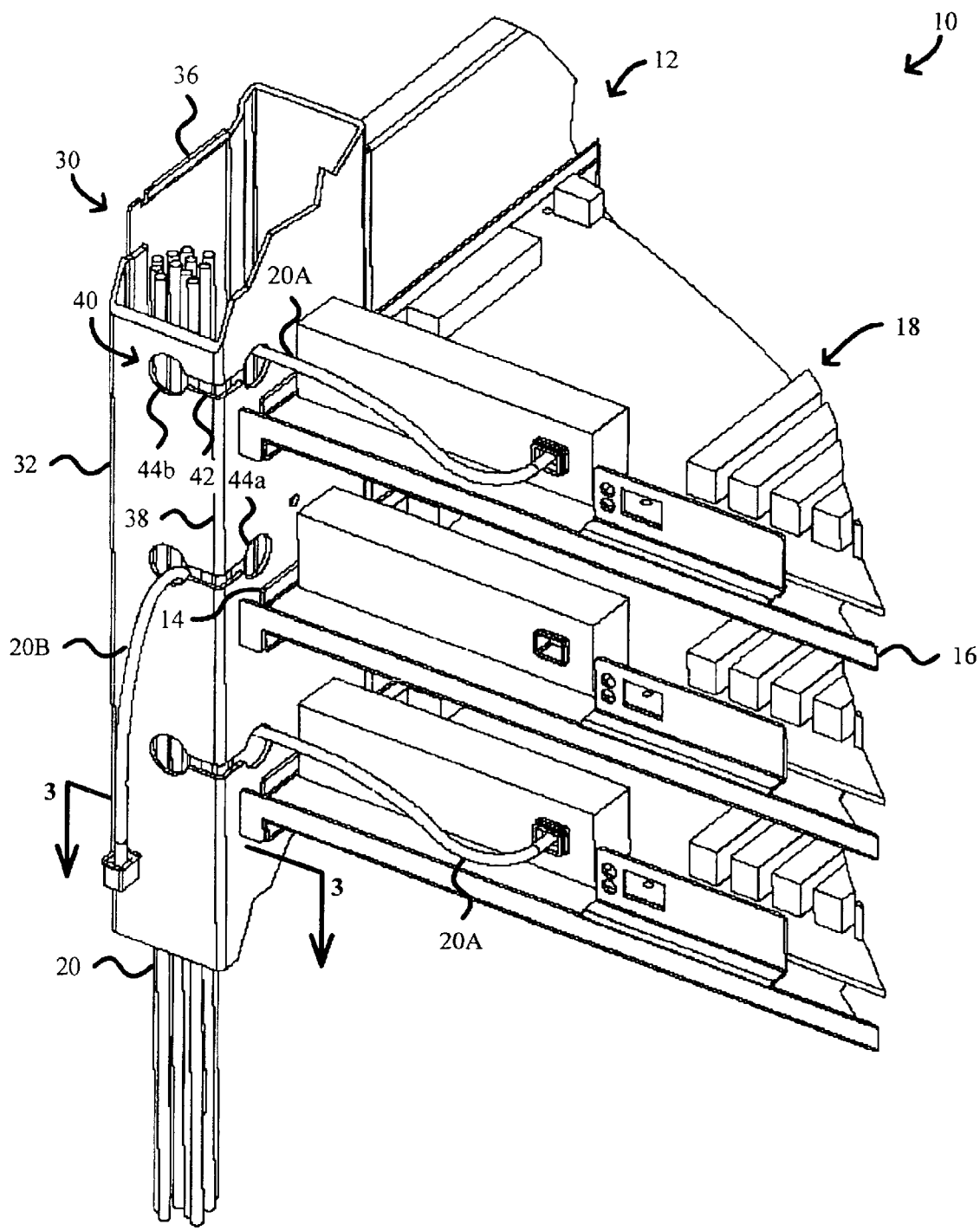
FIG. 1 is a partial perspective view of a rack-mounted system employing a cable management apparatus.

FIG. 1 is a partial perspective view of a rack-mounted system 10 employing a cable management apparatus 30. The rack-mounted system 10 may be any suitable rack system configured to employ the cable management apparatus 30. The rack-mounted system 10 generally includes a rack 12 having several sets of supports 14 for supporting a number of electronics modules or trays 16. Each electronics module 16 in turn contains various electronics components 18. Numerous cables 20 are connected to electronics components 18 and are housed and managed by the cable management apparatus 30.

Figure 2:
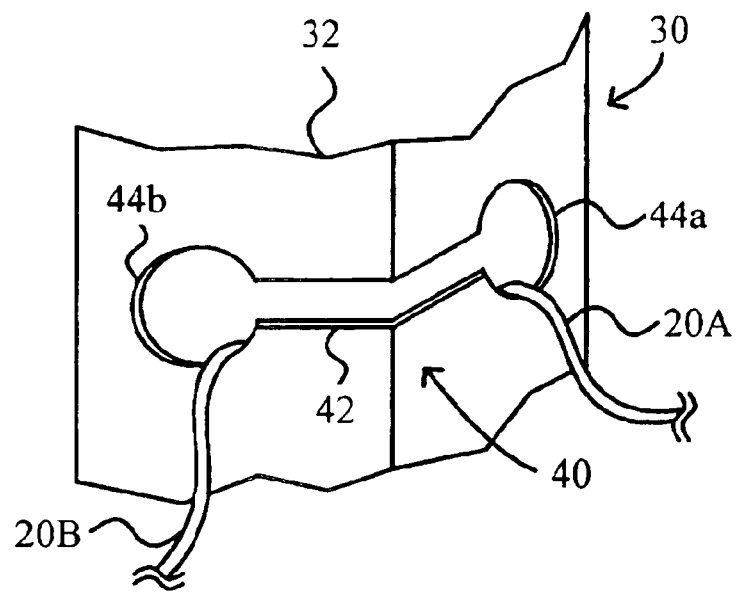
FIG. 2 is a schematic of a portion of the cable management apparatus.
Figure 3:
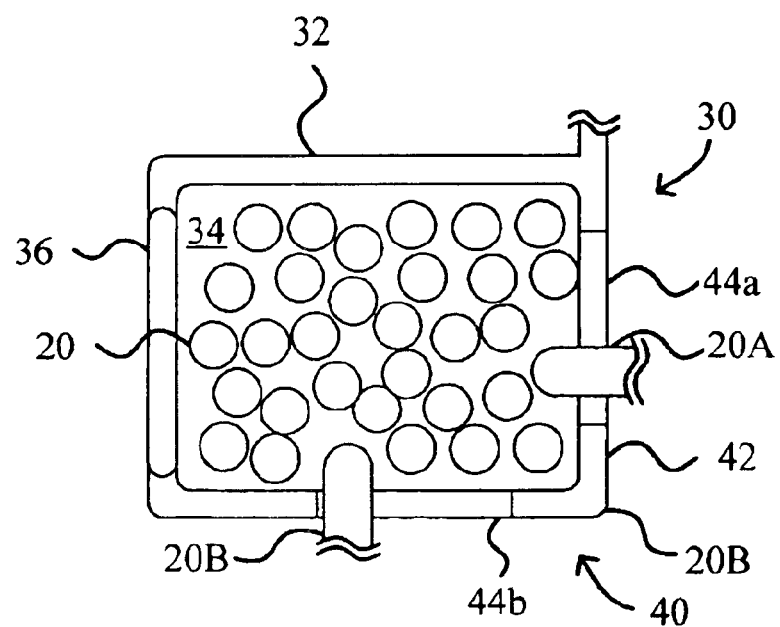
FIG. 3 is a partial cross-sectional view taken across line 3—3 in FIG. 1 for illustrating the cable management apparatus in more detail.

FIG. 2 is a schematic of a portion of the cable management apparatus 30 and FIG. 3 is a partial cross-sectional view taken across line 3—3 in FIG. 1 for illustrating the cable management apparatus 30 in more detail. In the example shown in FIGS. 1–3, the cable management apparatus 30 includes a housing 32 that defines a volume 34 in which the cables 20 are housed. The housed cables 20 generally run lengthwise along the length of the housing 32. Preferably, a substantial portion of the length of each cable 20 is housed within the volume while only a smaller portion of each cable 20 extends outside of the housing 32 to enable the cables 20 to make the necessary connections, for example. The housing 32 is generally rectangular in shape and defines an inside corner 38 adjacent to the interior of the rack 12, i.e., immediately adjacent to the electronics module supports 14. The housing 32 is preferably generally enclosed but may provide a removable side or panel 36 that allows the cables 20 to be easily positioned into and removed from the volume 34.

The housing 32 also defines openings 40 to allow end segments of one or more cables housed within the volume 34 to extend outside of the housing 32 via the openings 40 and optionally to be connected to the appropriate electronics components 18 on the corresponding electronics modules 16. The openings 40 and the supports 14 preferably have a one-to-one correspondence such that any given opening 40 corresponds to only one set of supports 14 and thus to only one electronics module 16. With such one-to-one correspondence, only cables 20 that are connected to, to be connected to, or otherwise associated with or corresponds to the electronics components 18 on the corresponding electronics module 16 extends through that opening 40. Such a configuration facilitates cable management and organization.

Preferably, each opening 40 extends in both directions along the housing 32 from the inside corner 38 of the housing 32. In one embodiment, the opening 40 resembles a dumbbell shape with an approximately 90° bend defined at the inside corner 38. The opening 40 includes a narrow bent portion 42 that extends in both directions from the inside corner 38 to connect to two larger circular openings 44a, 44b such that the two larger circular openings 44a, 44b are disposed at approximately 90° relative to each other. One of the two enlarged circular openings 44a is disposed adjacent to the electronics module 16 to which the opening 40 corresponds. The circular opening 44a adjacent to the electronics module 16 allows several cables 20A to simultaneously extend therethrough so that several cables 20A may simultaneously be utilized for connections to various electronics components 18 of the corresponding electronics module 16. As shown in FIGS. 1–3, each cable 20A extending through the circular openings 44a adjacent to the electronics module 16 is also connected an appropriate electronics component 18 on the corresponding electronics module 16.

Similarly, the other circular opening 44b distal to the electronics module 16 allows several cables 20 to extend therethrough so that several cables 20 may simultaneously be hanging freely while, for example, the corresponding electronics module 16 is being serviced. The narrow bent portion 42 extending between the two circular openings 44a, 44b facilitates selective passing of a cable 20 between the two circular openings 44a, 44b while preferably restricting the free flow of cables therebetween. Typically, the height of the narrow bent portion 42 is at least slightly greater than the diameter of a typical cable 20.

The circular opening 44b distal to the electronics module 16 facilitates management of the end segment of the disconnected cable and keeps the end segment of the disconnected cable out of the way of the electronics modules 16, i.e., out of the path of travel of the electronics modules 16. The circular opening 44b, by being distal to the electronics module 16, thus also helps to prevent the disconnected cable 20b from interfering with or even be damaged by the removal of the corresponding electronics module. This is in contrast to conventional cable management systems that requires the service technician to manually keep the disconnected free and clear of moving parts during the removal and/or reinstallation of the electronics module. Such conventional cable management systems thus make the process of removing and/or reinstalling the electronics module awkward and difficult for the service technician.

In the example shown in FIGS. 1–3, the end segment of the cable 20B extending through the circular opening 44b distal to the electronics module 16 is disconnected from the electronics module 16 and is simply hanging from that distal circular openings 44b. Note that the cable 20B is out of the way of the electronics module 16 so that the electronics module 16 can be easily removed and replaced without having the cable as an obstruction. The cable 20B may be passed to the circular opening 44a proximal to the electronics module 16 via the narrow bent portion 42 when the corresponding electronics module 16 is ready to be reconnected to the appropriate cables such as when the servicing and maintenance of the corresponding electronics module 16 is complete and the electronics module 16 is reinstalled into the rack 12 and is ready to be reconnected with the appropriate cables.

Multiple cable management apparatuses 30 may be employed in a single rack. For example, a cable management apparatus 30 may be employed in the front and in the back of the rack system. For example, the cable management apparatuses 30 may be disposed on the same side of but at the front and the back of the electronics modules. Other suitable configurations may also be employed. The cable management apparatus 30 may optionally serve as a structural component of the rack 12 such that the cable management apparatus 30 and the rack 12 may be both formed of steel or similar materials. The cable management apparatus 30 may alternatively be made of any other suitable material such as a suitably rigid plastic or other non-conductive material for economy and added protection of the cables.

As is evident, the cable management apparatus 30 is an economical and effective way to house and manage the cables 20. The cable management apparatus 30 houses and manages the cables 20 both when the cables 20 are connected and when disconnected so as to protect the cables 20 from accidental damage or displacement. The cable management apparatus 30 may also facilitate in reducing entanglement amongst the cables 20. In addition, the cable management apparatus 30 facilitates the management and organization of numerous cables to allow for convenient, accurate, and easy access, particularly when the corresponding electronics module is being serviced.

It is noted that the cable management apparatus 30 may have any suitable cross sectional shape such as a square, circle, elliptical, etc. In addition, the cable management apparatus 30 need not have an enclosed housing but may instead, for example, have an L-shaped housing (such as that shown in FIG. 2), a U-shaped housing. As another example, the cable management apparatus 30 may have a hinged panel rather than a removable panel 36 so as to generally enclose the volume 34.

While the preferred embodiments of the present invention are described and illustrated herein, it will be appreciated that they are merely illustrative and that modifications can be made to these embodiments without departing from the spirit and scope of the invention. Thus, the invention is intended to be defined only in terms of the following claims.

What is claimed is:

1. A cable management system for managing cables to be connected to electronics devices, comprising:
   a cable management housing to substantially house the cables to be managed therein, the cable management housing defining a plurality of openings configured to contain a plurality of cables extending therethrough, each opening having:
      a first opening portion configured to contain a plurality of cables extending therethrough,
      a second opening portion configured to contain a plurality of cables extending therethrough, the second opening portion being disposed further away from the electronics devices than the first opening portion, and
      a passage portion extending between the first and second opening portions, the passage portion being configured to allow passing of at least one cable between the first and second opening portions and configured to be of a size smaller than the first opening portion and the second opening portion.

2. The cable management system of claim 1, wherein the first opening portion is disposed proximal to the electronics devices to allow the cables passing therethrough to be in a first cable position corresponding to the cables being connected to the electronics devices and wherein the second opening portion is disposed distal to the devices to allow the cables passing therethrough to be in a second cable position corresponding to the cables being disconnected from the electronics devices.

3. The cable management system of claim 1, wherein the first and second opening portions are generally circular.

4. The cable management system of claim 1, wherein the cable management housing is generally rectangular and having a corner proximal to the electronics devices and wherein the passage portion is generally a bent portion extending in at least two directions from the corner.

5. The cable management system of claim 4, wherein the first opening portion and the second opening portion are disposed on opposing sides of the corner.

6. The cable management system of claim 1, wherein the first and second opening portions are disposed at an angle relative to each other.

7. The cable management system of claim 1, wherein the first and second opening portions are disposed at an approximately 90° relative to each other.

8. The cable management system of claim 1, wherein the cable management housing includes a removable side portion to facilitate access to the cables housed within the cable management housing.

9. The cable management system of claim 1, wherein the cable management housing extends along a first direction and the plurality of openings are disposed along the first direction, the passage portion being of a smaller size in the first direction than the first opening portion and the second opening portion.

10. A cable management apparatus for managing cables to be connected to electronics devices coupled to removable modules in a rack-mounted system, comprising:
    a cable management housing extending along the removable modules to house the cables to be managed therein, the cable management housing defining a plurality of openings configured to contain a plurality of cables extending therethrough, each opening having:
       a first portion configured to contain a plurality of cables extending therethrough,
       a second portion disposed at an angle relative to the first portion, the second portion being configured to contain a plurality of cables extending therethrough, and
       a passing portion extending between the first and second portions, the passing portion being configured to allow passing of at least one cable between the first and second portions, and configured to be of a size smaller than the first opening portion and the second opening portion.

11. The apparatus of claim 10, wherein each opening corresponds to at most one removable module of the rack-mounted system.

12. The apparatus of claim 10, wherein the first portion is disposed proximal to the electronics devices to allow the cables passing therethrough to be in a first position for connection to the electronics devices and wherein the second portion is disposed distal to the devices in the rack-mounted system to allow the cables passing therethrough to be in a second position corresponding to the cables being disconnected from the electronics devices.

13. The apparatus of claim 10, wherein the first and second portions are generally circular.

14. The apparatus of claim 10, wherein the cable management housing is generally rectangular and having a corner proximal to the devices in the rack-mounted system and wherein the passage portion is generally a bent portion extending in at least two directions from the corner.

15. The apparatus of claim 14, wherein the first portion and the second portion are disposed on opposing sides of the corner.

16. The apparatus of claim 10, wherein the cable management housing extends along a first direction and the plurality of opening are disposed along the first direction, the passage portion being of a smaller size in the first direction than the first opening portion and the second opening portion.

17. The apparatus of claim 10, wherein the cable management housing forms a structural component of the rack-mounted system for housing the removable modules.

18. A method for managing cables to be connected to electronics devices, comprising the steps of:

routing a plurality of cables to be managed through a cable management housing, substantially enclosing the cables therein;

passing a portion of at least one cable through a first portion of one of a plurality of openings defined in the cable management housing the openings being configured to contain a plurality of cables extending therethrough, each opening including a first and second portion each configured to contain a plurality of cables extending therethrough, and a passage portion extending between the first and second portions to allow passage of a cable therebetween and configured to be of a size smaller than the first opening portion and the second opening portion; and passing the portion of the cable through the passage portion to the second portion of the opening.

19. The method of claim 18, wherein the step of passing the portion of the cable through the first portion of the opening includes positioning the portion of the cable proximal to the electronics devices and wherein the step of passing the portion of the cable through the passage portion to the second portion includes positioning the portion of the cable distal to the electronics devices.

20. The method of claim 18, wherein the step of passing the portion of the cable through the passage portion to the second portion includes passing the portion of the cable around a corner such that the first and second portions of the opening are at an angle relative to each other.

21. The method of claim 18, wherein the cable management housing extends along a first direction and the plurality of openings are disposed along the first direction, the passage portion being of a smaller size in the first direction than the first opening portion and the second opening portion.

* * * * *